US012665392B2

(12) United States Patent
Fournier et al.

(10) Patent No.: US 12,665,392 B2
(45) Date of Patent: Jun. 23, 2026

(54) METHOD FOR PRODUCING OPTOELECTRONIC DEVICES

(71) Applicant: COMMISSARIAT A L'ENERGIE ATOMIQUE ET AUX ENERGIES ALTERNATIVES, Paris (FR)

(72) Inventors: Maryse Fournier, Grenoble cedex (FR); Badhise Ben Bakir, Grenoble cedex (FR); Sergio Nicoletti, Grenoble cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/799,404

(22) Filed: Aug. 9, 2024

(65) Prior Publication Data

US 2025/0055261 A1    Feb. 13, 2025

(30) Foreign Application Priority Data

Aug. 10, 2023    (FR) ...................................... 2308645

(51) Int. Cl.
　　*H01S 5/34*　　　　(2006.01)
　　*H01S 5/02*　　　　(2006.01)
　　　　　　(Continued)
(52) U.S. Cl.
　　CPC ............ *H01S 5/3402* (2013.01); *H01S 5/021* (2013.01); *H01S 5/12* (2013.01); *H01S 5/2275* (2013.01); *H01S 5/4087* (2013.01)

(58) Field of Classification Search
　　CPC ......... H01S 5/3401–3402; H01S 5/021; H01S 5/12–125; H01S 5/4031–4068; H01S 5/4087–4093
　　See application file for complete search history.

(56) References Cited

U.S. PATENT DOCUMENTS

| 6,546,035 B2 | 4/2003 | Imafuji et al. |
| 6,618,420 B1 * | 9/2003 | Gen-Ei ................. H01S 5/4031 |
| | | 372/50.1 |

(Continued)

FOREIGN PATENT DOCUMENTS

WO　　WO 2007/032268 A1　　3/2007

OTHER PUBLICATIONS

Preliminary Search Report & Written Opinion issued Jul. 16, 2024, in corresponding French Patent Application No. 2308645 (with English Translation) 18 pages.

*Primary Examiner* — Sean P Hagan
(74) *Attorney, Agent, or Firm* — Oblon, McClelland, Maier & Neustadt, L.L.P.

(57)　　　　　ABSTRACT
A method for manufacturing a first optoelectronic device operating at a wavelength $\lambda1$ and a second optoelectronic device operating at a wavelength $\lambda2>\lambda1$, the first device comprising a first stack comprising a first encapsulation layer of thickness $e10$ and layers of thickness $e1i$ ($i=1 \ldots n$), and the second device comprising a second stack comprising a second encapsulation layer of thickness $e20$ and layers of thickness $e2i$ ($i=1 \ldots n$). The method includes forming the second stack by sizing the thicknesses $e20$ and $e2i$ according to $\lambda2$, forming the first stack by sizing the thicknesses $e1i$ by homothety and adjusting the thickness $e10$ such that the stacks have the same height, and performing out one same technological step on the stacks.

17 Claims, 5 Drawing Sheets

(51) Int. Cl.
  *H01S 5/12*        (2021.01)
  *H01S 5/227*       (2006.01)
  *H01S 5/40*        (2006.01)

(56)            References Cited

U.S. PATENT DOCUMENTS

| | | | |
|---|---|---|---|
| 7,433,380 B2 | 10/2008 | Takayama et al. | |
| 2005/0030997 A1 | 2/2005 | Tanaka et al. | |
| 2005/0276298 A1* | 12/2005 | Fischer | H01S 5/12 |
| | | | 372/50.1 |
| 2010/0074289 A1 | 3/2010 | Kobayashi et al. | |
| 2010/0079359 A1* | 4/2010 | Kunoh | H04N 9/3161 |
| | | | 345/55 |
| 2013/0156052 A1* | 6/2013 | Diehl | H01S 5/0612 |
| | | | 372/20 |
| 2013/0195136 A1* | 8/2013 | Takagi | H01S 5/2054 |
| | | | 372/45.012 |
| 2014/0355637 A1* | 12/2014 | Hashimoto | H01S 5/34313 |
| | | | 372/45.012 |
| 2021/0305785 A1* | 9/2021 | Hashimoto | H01S 5/3402 |
| 2022/0181850 A1* | 6/2022 | Fournier | H01S 5/3401 |

* cited by examiner

E1 ——— Substrate block (22 steps)

E2 ——— DFB (In) block (12 steps) of which 7 I functions

E3 ——— Ridge guide block (14 steps)    → Fixe

E4 ——— Lower contact block (10 steps) → Fixe

E5 ——— Upper contact block (10 steps) → Fixe

E6 ——— Metallisation block (16 steps)    → Fixe

METHOD FOR PRODUCING OPTOELECTRONIC DEVICES

TECHNICAL FIELD

The present invention relates to the field of optoelectronics. It can be implemented for producing light-emitting components, in particular in the medium infrared (MIR) range. It has a particularly advantageous application in producing quantum cascade laser sources emitting at different wavelengths.

PRIOR ART

The medium infrared (MIR) range has a relatively wide spectral range, covering in particular wavelengths of between 4 μm and 10 μm. Manufacturing monochromatic MIR light sources over this spectral range generally requires a dedicated manufacturing line for each wavelength. This makes it possible to adjust the structure of each MIR source to optimise the operation of these sources. An MIR source emitting at 4 μm is thus structurally different from an MIR source emitting at 10 μm. An MIR source typically comprises a stack of Ill-V material-based, optically active layers, intended in particular to emit, propagate and/or confine a light radiation. According to the wavelength of desired emission, the thicknesses of these layers can be very different from one MIR source to another.

The methods for manufacturing these MIR sources are therefore complex and expensive to implement. A challenge consists of simplifying the methods for manufacturing these MIR sources to develop a technological sector which is compatible with the microelectronics industry for a wide wavelength range.

An aim of the present invention is to at least partially meet this need.

In particular, an aim of the present invention is a method for manufacturing optoelectronic devices operating at different wavelengths, which is less expensive and/or which has a better industrial compatibility with respect to current methods. Such a method is advantageously implemented to produce different optoelectronic devices operating at different wavelengths.

Other aims, features and advantages of the present invention will appear upon examining the description below and the accompanying drawings. It is understood that other advantages can be incorporated.

SUMMARY

To achieve this aim, according to an embodiment, a method for manufacturing at least one first optoelectronic device operating at a first wavelength $\lambda 1$ and a second optoelectronic device operating at a second wavelength $\lambda 2 > \lambda 1$ is provided.

The first optoelectronic device comprises a first stack along a direction z on a first substrate and the first stack comprises a first lower encapsulation layer of thickness $e10$ along the direction z and a plurality of first layers of thickness $e1i$ (i=1 . . . m) along the direction z. The second optoelectronic device comprises a second stack along the direction z on a second substrate and the second stack comprises a second lower encapsulation layer of thickness $e20$ along the direction z and a plurality of second layers of thickness $e2i$ (i=1 . . . n) along the direction z. The second layers of thickness $e2i$ have optical functions which are similar to those of the first layers of thickness $e1i$.

Advantageously, the method comprises the following steps:

Forming the second stack on the second substrate, by sizing the thicknesses $e20$ and $e2i$ according to the second wavelength $\lambda 2$, Forming the first stack on the first substrate, by sizing the thicknesses $e10$ and $e1i$ according to:

$$e1i = e2i \cdot \frac{\lambda 1}{\lambda 2} \cdot \alpha i \text{ with } 0.7 \le \alpha i \le 1.3$$

$$e10 = e20 + \sum_{i=1}^{n} e2i - \sum_{i=1}^{n} e1i$$

Carrying out at least one additional same technological step on the first and second stacks, for example, an etching of the first and second stacks along one same depth along z, so as to obtain the first and second optoelectronic devices.

In this method, the first and second stacks are sized so as to advantageously have one same height. The first and second stacks can thus be advantageously structured by one or more common technological steps. Etching patterns can be defined via common photolithography parameters for the two stacks (thickness of the resins, focal plane, etc.). The first and second stacks can then be etched by one same etching method. The passivation and the subsequent formation of contacts can also be carried out in the same way on the two stacks.

Typically, the steps of forming the first and second stacks are done separately. The first stack can be formed by epitaxy on a donor substrate before being added on the first substrate. The second stack can be formed by epitaxy on another donor substrate before being added on the second substrate. After formation of the first and second stacks, a certain number of common technological steps can be carried out on these two stacks. This makes it possible to design a common technological sector for producing the first and second optoelectronic devices. The first and second stacks can advantageously form part of one same technological batch. According to an example, the first stack on the first substrate forms a first a first plate of this technological batch and the second stack on the second substrate forms a second plate of this technological batch. When a piece of equipment of the microelectronic industry receives such a technological batch, each plate of the technological batch is treated in the same way by the equipment. The cost of the method for manufacturing the first and second optoelectronic devices is advantageously decreased.

According to another aspect of the invention, a system is provided for manufacturing at least one first optoelectronic device operating at a first wavelength $\lambda 1$ and a second optoelectronic device operating at a second wavelength $\lambda 2 > \lambda 1$. The system comprises at least one first substrate carrying a first stack along a direction z and a second substrate carrying a second stack along the direction z. The first stack comprises a first lower encapsulation layer of thickness $e10$ along the direction z and a plurality of first layers of thickness $e1i$ (i=1 . . . n) along the direction z. The second stack comprises a second lower encapsulation layer of thickness $e20$ along the direction z and a plurality of second layers of thickness $e2i$ (i=1 . . . n) along the direction z. The second layers of thickness $e2i$ and the first layers of thickness $e1i$ have similar optical functions.

Advantageously, the thicknesses $e10$, $e20$ and $e1i$, $e2i$ verify the following relationship:

$$e1i = e2i \cdot \frac{\lambda1}{\lambda2} \cdot \alpha i \text{ with } 0.7 \leq \alpha i \leq 1.3$$

$$e10 = e20 + \sum_{i=1}^{n} e2i - \sum_{i=1}^{n} e1i$$

The first and second stacks thus have substantially one same height along z.

According to an example, this system corresponds to a technological batch of the microelectronics industry, in which the first stack on the first substrate forms a first plate and the second stack on the second substrate forms a second plate. Such a batch can advantageously be treated by common technological steps, to form different first and second optoelectronic devices. The advantages mentioned above for the method apply mutatis mutandis.

According to another aspect of the invention, a device is provided, comprising a first stack and a second stack structured on one same support. The first stack comprises a first lower encapsulation layer of thickness e10 along a direction z and at least:

one first active layer of thickness e11 along z, intended to emit or receive a radiation having a first wavelength λ1, and one first upper encapsulation layer of thickness e12 along z.

The second stack comprises a second lower encapsulation layer of thickness e20 along the direction z and at least:

one second active layer of thickness e21 along z, intended to emit or receive a radiation having a second wavelength λ2>λ1, and one second upper encapsulation layer of thickness e22 along z.

Advantageously, the thicknesses e11, e12 verify the following relationship:

$$e12 = e22 \cdot \frac{\lambda1}{\lambda2} \cdot \alpha2 \text{ with } 0.7 \leq \alpha2 \leq 1.3$$

$$e11 = e21 \cdot \frac{\lambda1}{\lambda2} \cdot \alpha1 \text{ with } 0.7 \leq \alpha1 \leq 1.3$$

Advantageously, the first and second stacks have substantially one same height h along z.

BRIEF DESCRIPTION OF THE FIGURES

The aims, objectives, as well as the features and advantages of the invention will best emerge from the detailed description of embodiments of the latter, which are illustrated by the following accompanying drawings, in which.

Figure 1:
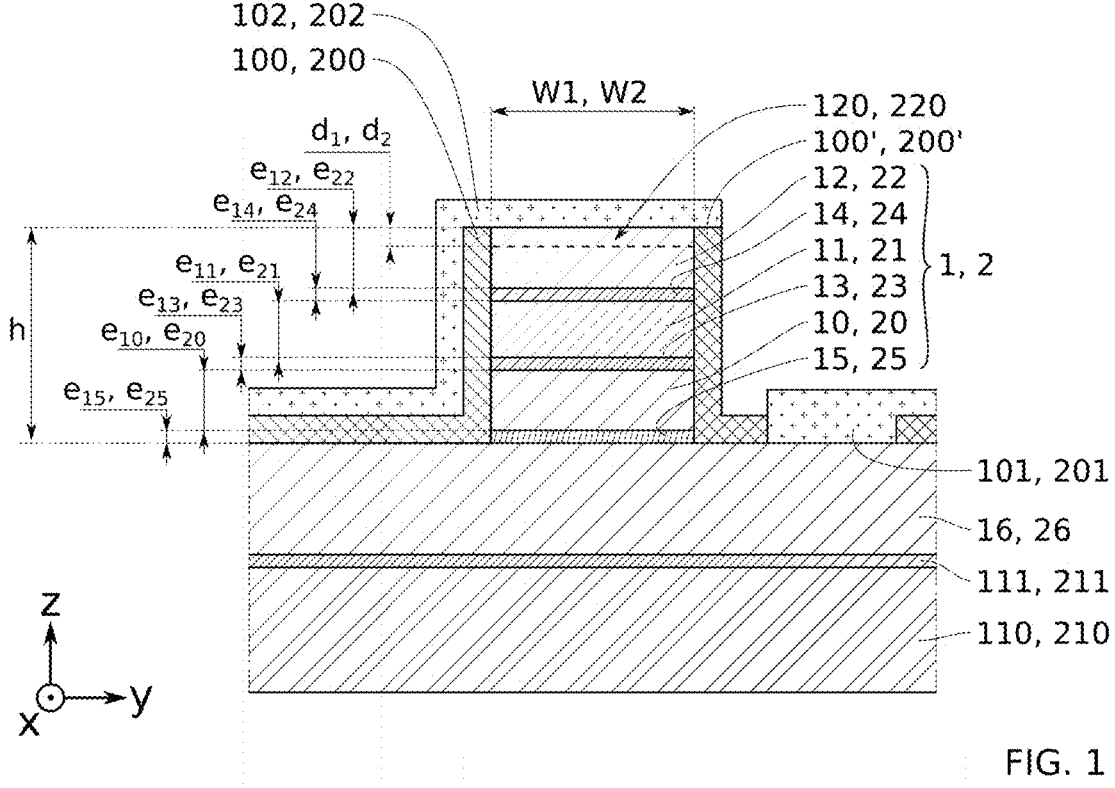
FIG. 1 illustrates, as a cross-section, an optoelectronic device according to an embodiment of the present invention.

The drawings are given as examples and are not limiting of the invention. They constitute principle schematic representations intended to facilitate the understanding of the invention and are not necessarily to the scale of practical applications. In particular, on the principle diagrams, the thicknesses of the different layers and portions, and the dimensions of the patterns are not representative of reality.

DETAILED DESCRIPTION

Before starting a detailed review of embodiments of the invention, optional features are stated below, which can optionally be used in association or alternatively:

According to an example, the at least one same technological step of the production method comprises one or more steps taken from among: an etching along z of a waveguide pattern, a passivation, a formation of an upper electric contact, a formation of a lower electric contact, a metallisation. Advantageously, all these steps can be carried out both on the first stack and on the second stack. Some of the methods for producing the first and second optoelectronic devices is common. This makes it possible to design a partially generic technological sector for producing different optoelectronic devices emitting at different wavelengths, in particular in the medium infrared range.

According to an example, the plurality of first layers of thickness e1i comprises at least one first active layer of thickness e11 along z, intended to emit or receive a radiation having the first wavelength λ1, and a first upper encapsulation layer of thickness e12 along z. According to an example, the plurality of second layers of thickness e2i comprises at least one second active layer of thickness e21 along z, intended to emit or receive a radiation having the second wavelength λ2, and a second upper encapsulation layer of thickness e22 along z. The first and second stacks comprise similar layers typically having the same functions. In particular, each stack comprises an active layer sandwiched between encapsulation layers. The encapsulation layers can also be qualified as "coating layers" or "covering layers"; the encapsulation layers are typically called "cladding layers".

According to an example, the plurality of first layers of thickness e1i further comprises a first lower optical confinement layer of thickness e13 inserted between the first lower encapsulation layer and the first active layer, and a first upper optical confinement layer of thickness e14 inserted between the first upper encapsulation layer and the first active layer. According to an example, the plurality of second layers of thickness e2i further comprises a second lower optical confinement layer of thickness e23 inserted between the second lower encapsulation layer and the second active layer, and a second upper optical confinement layer of thickness e24 inserted between the second upper encapsulation layer and the second active layer, with:

$$e11 = e21 \cdot \frac{\lambda1}{\lambda2} \cdot \alpha1 \text{ with } 0.7 \leq \alpha1 \leq 1.3$$

-continued $$e12 = e22 \cdot \frac{\lambda 1}{\lambda 2} \cdot \alpha 2 \text{ with } 0.7 \le \alpha 2 \le 1.3$$

$$e13 = e23 \cdot \frac{\lambda 1}{\lambda 2} \cdot \alpha 13 \text{ with } 0.7 \le \alpha 3 \le 1.3$$

$$e14 = e24 \cdot \frac{\lambda 1}{\lambda 2} \cdot \alpha 4 \text{ with } 0.7 \le \alpha 4 \le 1.3$$

$$e10 = e20 + e21 + e22 + e23 + e24 - (e12 + e11 + e13 + e14)$$

According to an example, the plurality of first layers of thickness $e1i$ further comprises a first stop layer of thickness $e15$ under the first lower encapsulation layer. According to an example, the plurality of second layers of thickness $e2i$ further comprises a second stop layer of thickness $e25$ under the second lower encapsulation layer. According to an example, the thicknesses $e15$, $e25$ are such that:

$$e15 = e25 \cdot \frac{\lambda 1}{\lambda 2} \cdot \alpha 5 \text{ with } 0.7 \le \alpha 5 \le 1.3$$

This makes it possible to avoid an evanescent wave phenomenon by the first stop layer of thickness $e15$.

According to an example, the first and second stacks are etched along one same depth h along z to form first and second protruding structures, respectively having a first width $W1$ along a direction x and a first length $L1$ along a direction y, and a second width $W2$ along the direction x and a second length $L2$ along the direction y, the method further comprising, before etching of the first and second stacks:

Determining the second width $W2$ and the second length $L2$ according to the second wavelength $\lambda 2$, Determining the first width $W1$ and the first length $L1$ according to:

$$W1 = W2 \cdot \frac{\lambda 1}{\lambda 2} \cdot \alpha_W \text{ with } 0.7 \le \alpha_W \le 1.3$$

$$L1 = L2 \cdot \frac{\lambda 1}{\lambda 2} \cdot \alpha_L \text{ with } 0.7 \le \alpha_L \le 1.3$$

According to an example, the method further comprises a first etching configured to form a first array having a first depth on the first stack carried by the first substrate, and independently a second etching configured to form a second array having a second depth on the second stack carried by the second substrate. This typically makes it possible to produce distributed feedback (DFB) lasers. The first and second arrays are specific to the wavelength. They are typically formed by first and second independent etchings.

According to an example, the first and second wavelengths $\lambda 1$, $\lambda 2$ are chosen in the medium infrared range between 2 μm and 15 μm, preferably between 4 μm and 10 μm.

According to an example, the first stack is bordered by first trenches of depth h along the direction z and forms a first protruding structure, and the second stack is bordered by second trenches of the same depth h along the direction z and forms a second protruding structure.

According to an example, the plurality of first layers of thickness $e1i$ comprises at least one first active layer of thickness $e11$ along z, intended to emit or receive a radiation having the first wavelength $\lambda 1$, and a first upper encapsulation layer of thickness $e12$ along z, and the plurality of second layers of thickness $e2i$ comprises at least one second active layer of thickness $e21$ along z, intended to emit or receive a radiation having the second wavelength $\lambda 2$, and a second upper encapsulation layer of thickness $e22$ along z, with:

$$e12 = e22 \cdot \frac{\lambda 1}{\lambda 2} \cdot \alpha 2 \text{ with } 0.7 \le \alpha 2 \le 1.3$$

$$e11 = e21 \cdot \frac{\lambda 1}{\lambda 2} \cdot \alpha 1 \text{ with } 0.7 \le \alpha 1 \le 1.3$$

According to an example, the first protruding structure has a first width $W1$ along a direction x and a first length $L1$ along a direction y, and the second protruding structure has a second width $W2$ along the direction x and a second length $L2$ along the direction y, the first and second widths $W1$, $W2$ and the first and second lengths $L1$, $L2$ verifying the following relationship:

$$W1 = W2 \cdot \frac{\lambda 1}{\lambda 2} \cdot \alpha_W \text{ with } 0.7 \le \alpha_W \le 1.3$$

$$L1 = L2 \cdot \frac{\lambda 1}{\lambda 2} \cdot \alpha_L \text{ with } 0.7 \le \alpha_L \le 1.3$$

According to an example, the first and second substrates are based on silicon and the first and second stacks are based on Ill-V materials, the first and second stacks respectively comprising first and second optical isolation layers configured to avoid an optical coupling at the wavelengths $\lambda 1$ and $\lambda 2$ with the first and second substrates.

According to an example, the first and second optoelectronic devices correspond to first and second distributed feedback quantum cascade lasers.

Unless incompatible, it is understood that all of the optional features above and/or the variants indicated can be combined so as to form an embodiment which is not necessarily illustrated or described. Such an embodiment is clearly not excluded from the invention. The features of an aspect of the invention, for example, the system, the device or the method, can be adapted mutatis mutandis to another aspect of the invention.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By a substrate, a stack, a layer, "based on" a material A, this means a substrate, a stack, a layer comprising this material A only or this material A and optionally other materials, for example, alloy elements and/or doping elements. Thus, a substrate based on silicon means, for example, an Si or doped Si, or also SiGe substrate. An layer based on InP means, for example, an InP, doped InP, or InP alloy layer. A passivation layer based on silicon nitride SiN can, for example, comprise non-stoichiometric silicon nitride (SixNy), or stoichiometric silicon nitride (Si3N4).

Several embodiments of the invention implementing successive steps of the manufacturing method are described below. Unless explicitly mentioned, the adjective "successive" does not necessarily imply, even if this is generally preferred, that the steps follow one another immediately, intermediate steps being able to separate them.

Moreover, the term "step" means the embodiment of a part of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of the phases of the method.

A preferably orthonormal system, comprising the axes x, y, z is represented in the accompanying figures. When one single system is represented on one same set of figures, this system applies to all the figures of this set.

In the present patent application, the thickness of a layer is taken along a direction normal to the main extension plane of the layer. Thus, a layer typically has a thickness along z. The relative terms "on", "surmounts", "under", "underlying", "inserted", "above", "below" refer to positions taken along the direction z. This list of terms is not exhaustive. Other relative terms can be easily specified as needed, by referring to the accompanying drawings.

The terms "vertical", "vertically" refer to a direction along z. The terms "horizontal", "horizontally", "lateral", "laterally" refer to a direction in the plane xy. Unless explicitly mentioned, the thickness, the height and the depth are measured along z.

An element located "in vertical alignment with" or "to the right of" another element means that these two elements are both located on one same line perpendicular to a plane in which a lower or upper face of a substrate mainly extends, i.e. on one same line oriented vertically in the figures.

The present invention has, as a preferable field of application, a developing platform for manufacturing quantum cascade lasers QCL in the spectral medium infrared (MIR) range.

The optoelectronic devices according to the present invention typically emit monochromatic or quasi-monochromatic light radiations, each having a main wavelength. The main wavelength is the only wavelength emitted by a monochromatic laser, or the wavelength mainly emitted by a quasi-monochromatic laser.

In the scope of the present invention, the light radiation is typically guided and/or confined so as to ensure its propagation along a main propagation direction, taken along the axis x in the accompanying drawings. The light radiation is preferably consistent and monochromatic. The light radiation propagates preferably according to one single optical propagation mode, typically the electric transverse (TE00) or magnetic transverse (TM00) fundamental optical mode.

To guide and/or confine the light radiation, the first and second stacks are typically structured to form first and second protruding structures, respectively. Below, the first protruding structure typically corresponds to a part of the first stack. The second protruding structure typically corresponds to a part of the second stack.

The terms "substantially", "about", "around" mean "plus or minus 10%" or, when this is an angular orientation, "plus or minus 10°"" and preferably "plus or minus 5°"". Thus, a direction which is substantially normal to a plane means a direction having an angle of $90 \pm 10°$ with respect to the plane.

FIG. 1 generically illustrates an optoelectronic device according to the invention. The numerical references starting with the digit 1 relate to a first optoelectronic device. The numerical references starting with the digit 2 relate to a second optoelectronic device. The first and second optoelectronic devices typically comprise the same elements. There is a correspondence of function between two elements of the same nature. The alphanumerical references starting with a letter followed by the digit 1 relate to dimensions of the first optoelectronic device. The alphanumerical references starting with a letter followed by the digit 2 relate to dimensions of the second optoelectronic device. The dimensions of the elements of the first optoelectronic device are typically different from those of the elements of the second optoelectronic device. The first optoelectronic device is configured to operate at a first wavelength $\lambda_1$. The second optoelectronic device is configured to operate at a second wavelength $\lambda_2$.

The first optoelectronic device typically comprises, in a stack along z:

A first substrate 110, preferably based on silicon.

A first bonding layer 111, for example, based on SiO2.

A first optical isolation layer 16, typically based on InP.

A first etching stop layer 15 of thickness $e_{15}$, for example, based on InGaAs.

A first lower encapsulation layer 10 of thickness $e_{10}$, for example, based on InP.

A first lower optical confinement layer 13 of thickness $e_{13}$, for example, based on InGaAs.

A first active layer 11 of thickness $e_{11}$, comprising, for example, multiple quantum wells based on ternary AlInAs, GaInAs, or quaternaries of GaInAsP- or AlGaInAs-type. This first active layer 11 is preferably configured to emit a first light radiation of wavelength $\lambda_1$.

A first upper optical confinement layer 14 of thickness $e_{14}$, for example, based on InGaAs.

A first upper encapsulation layer 12 of thickness $e_{12}$, for example, based on InP. According to an option, the first upper encapsulation layer 12 can be structured in the form of an array 120. Such an array 120 is typically presented, in a known manner, in the form of trenches, regularly spaced apart along x. The trenches of the array 120 have a depth $d_1$ along z and are distributed along an array step $p_1$ along x. The depth $d_1$ and the array step $p_1$ depend on the wavelength $\lambda_1$.

The stack of layers 16, 15, 10, 13, 11, 14, 12 forms a first stack. This first stack is preferably based on Ill-V materials. It can be formed by epitaxy on a donor substrate, for example based on InP, then optionally added on the first substrate 110, for example, based on silicon. A first bonding layer 111, for example, based on silicon oxide, can thus be inserted between the first substrate 110 and the first stack. During epitaxy, the stack is typically presented in the form of planar layers extending over the entire surface of the donor substrate. This stack is then structured, in order to produce the first optoelectronic device.

In particular, the stack of layers 16, 15, 10, 13, 11, 14, 12 is at least partially etched along z so as to form a first structure 1 protruding from the optical isolation layer 16. This first protruding structure 1 makes it possible, in particular, to confine and/or guide the first light radiation of wavelength $\lambda_1$ emitted by the first active layer 11. In this example, the first light radiation mainly propagates along x. The first optoelectronic device thus has a first characteristic dimension W1 along y.

The first optoelectronic device typically comprises one or more passivation layers 100, 100' on the flanks of the first protruding structure 1. The first optoelectronic device typically comprises a first lower electric contact 101 configured to inject charge carriers, for example, electrons, in the first active layer 11 via the first lower encapsulation layer 10, and a first upper electric contact 102 configured to inject charge carriers, for example holes, in the first active layer 11 via the first upper encapsulation layer 12. The first optoelectronic device is, for example, a first distributed feedback quantum cascade laser, emitting at the wavelength $\lambda_1$.

The second optoelectronic device typically comprises, in a stack along z:

A second substrate 210, preferably based on silicon.

A second bonding layer 211, for example, based on SiO2.

A second optical isolation layer 26, typically based on InP.

A second etching stop layer 25 of thickness $e_{25}$, for example, based on InGaAs.

A second lower encapsulation layer 20 of thickness $e_{20}$, for example, based on InP.

A second lower optical confinement layer 23 of thickness $e_{23}$, for example, based on InGaAs.

A second active layer 21 of thickness $e_{21}$, comprising, for example, multiple quantum wells based on ternary AlInAs, GaInAs, or quaternaries of GaInAsP- or AlGaInAs-type. This second active layer 21 is preferably configured to emit a second light radiation of wavelength $\lambda_2$.

A second upper optical confinement layer 24 of thickness $e_{24}$, for example, based on InGaAs.

A second upper encapsulation layer 22 of thickness $e_{22}$, for example, based on InP. According to an option, the second upper encapsulation layer 22 can be structured in the form of an array 220. Such an array 220 is typically presented, in a known manner, in the form of trenches regularly spaced apart along x. The trenches of the array 220 have a depth $d_2$ along z and are distributed along an array step $p_2$ along x. The depth $d_2$ and the array step $p_2$ depend on the wavelength $\lambda_2$.

The stack of layers 26, 25, 20, 23, 21, 24, 22 forms a second stack. This second stack is preferably based on III-V materials. It can be formed by epitaxy on a donor substrate, for example, based on InP, then optionally added on the second substrate 210, for example, based on silicon. A second bonding layer 211, for example, based on silicon oxide, can thus be inserted between the second substrate 210 and the second stack. During epitaxy, the stack is typically presented in the form of planar layers extending over the entire surface of the donor substrate. This stack is then structured in order to produce the second optoelectronic device.

In particular, the stack of layers 26, 25, 20, 23, 21, 24, 22 is at least partially etched so as to form a second structure 2 protruding from the optical isolation layer 26. This second protruding structure 2 makes it possible, in particular, to confine and/or guide the second light radiation of wavelength $\lambda_2$ emitted by the second active layer 21. In this example, the second light radiation propagates mainly along x. The second optoelectronic device thus has a second characteristic dimension W2 along y.

The second optoelectronic device typically comprises one or more passivation layers 200, 200' on the flanks of the second protruding structure 2. The second optoelectronic device typically comprises a second lower electric contact 201 configured to inject charge carriers, for example electrons, in the second active layer 21 via the second lower encapsulation layer 20, and a second upper electric contact 202 configured to inject charge carriers, for example holes, in the second active layer 21 via the second upper encapsulation layer 22. The second optoelectronic device is, for example, a second distributed feedback quantum cascade laser, emitting at the wavelength $\lambda_2$.

An aim of the present invention is to enable the manufacturing of the first and second optoelectronic devices by a partially common technological sector. The principle retained in the scope of the development of the present invention is based on a sizing of the layers of the first and second stacks, making it possible to obtain one same height h for the first and second structures 1, 2 protruding from the first and second optoelectronic devices. In particular, the present invention is based on rules of sizing in thickness of the etching stop layer, of the lower encapsulation layer, of the lower optical confinement layer, of the active layer, of the upper optical confinement layer, of the upper encapsulation layer, for each protruding structure 1, 2.

According to an embodiment, a first step consists of determining what the minimum height h is, making it possible to make all optoelectronic devices operate. In practice, the minimum height h typically corresponds to the optoelectronic device having the largest operating wavelength. In the example illustrated, the second wavelength $\lambda_2$ is greater than the first wavelength $\lambda_1$. The thicknesses $e_{25}$, $e_{20}$, $e_{23}$, $e_{21}$, $e_{24}$, $e_{22}$ of the layers 25, 20, 23, 21, 24, 22 are therefore first fixed such that the second optoelectronic device has the optical properties required for the second wavelength $\lambda_2$. In this case, $e_{25}+e_{20}+e_{23}+e_{21}+e_{24}+e_{22}=h$. The thicknesses $e_{15}$, $e_{10}$, $e_{13}$, $e_{11}$, $e_{14}$, $e_{12}$ of the layers 15, 10, 13, 11, 14, 12 are then calculated from the thicknesses $e_{25}$, $e_{20}$, $e_{23}$, $e_{21}$, $e_{24}$, $e_{22}$ of the layers 25, 20, 23, 21, 24, 22. This calculation typically consists of applying a homothety for the thicknesses $e_{15}$, $e_{13}$, $e_{11}$, $e_{14}$, $e_{12}$ of the layers 15, 13, 11, 14, 12, and of compensating the height difference with respect to h by making the thickness $e_{10}$ of the layer 10 vary. The first lower encapsulation layer 10 has a role of compensating in thickness and therefore looks like a buffer layer. The homothety factor depends on the wavelengths $\lambda_1$, $\lambda_2$.

According to an example of sizing, for a second wavelength $\lambda_2$=9.6 µm, the thicknesses $e_{26}$, $e_{25}$, $e_{20}$, $e_{23}$, $e_{21}$, $e_{24}$, $e_{22}$ of the layers 26, 25, 20, 23, 21, 24, 22 can be fixed such that:

The thickness e26 of the second optical isolation layer 26 is around 6.5 µm, The thickness e25 of the second stop layer 25 is around 300 nm, The thickness e20 of the second lower encapsulation layer 20 is around 0.7 µm, The thickness e23 of the second lower optical confinement layer 23 is around 175 nm, The thickness e21 of the second active layer 21 is around 3.09 µm, The thickness e24 of the second upper optical confinement layer 24 is around 195 nm, The thickness e22 of the second upper encapsulation layer 22 is around 0.7 µm.

According to an option, the sizing rules are written, for i=1 . . . n (with n=5 in the example illustrated):

$$eli = e2i \cdot \frac{\lambda 1}{\lambda 2} \cdot \alpha i \text{ with } 0.7 \leq \alpha i \leq 1.3$$

$$e10 = e20 + \sum_{i=1}^{n} e2i - \sum_{i=1}^{n} eli$$

$\alpha i$ is preferably around 1. This makes it possible to optimise the optical properties of each stack of layers, for each optoelectronic device. A tolerance of ±30% on the homothety factor can be applied for each of the thicknesses e1$i$, without the performance of the optoelectronic devices being substantially degraded.

According to another option, the homothety factor can be corrected from the refraction index dispersion, according to:

$$e1i = e2i \cdot \frac{\lambda1}{\lambda2} \cdot \frac{n2}{n1}$$

with n1, n2 the effective index of the layers of the stack at the wavelengths $\lambda_1$, $\lambda_2$ respectively.

The thickness $e_{16}$ of the first optical isolation layer 16 is preferably substantially equal to the thickness $e_{26}$ of the second optical isolation layer 26. The first and second stacks of layers based on III-V materials thus have a substantially identical total height.

The same homothety can be applied to the other dimensions of the first protruding structure 1, in particular to the width W1 along y and to the length L1 along x (not illustrated on the cross-section yz of the accompanying figures).

According to an option, the sizing rules for the width W1 and the length L1 are written:

$$W1 = W2 \cdot \frac{\lambda1}{\lambda2} \cdot \alpha_W \text{ with } 0.7 \leq \alpha_W \leq 1.3$$
$$L1 = L2 \cdot \frac{\lambda1}{\lambda2} \cdot \alpha_L \text{ with } 0.7 \leq \alpha_L \leq 1.3$$

A tolerance of ±30% on the homothety factor can be applied for each of these dimensions W1, L1. The performances of the optoelectronic devices remain substantially constant in this range of dimensions.

Figures 2A, 2B:
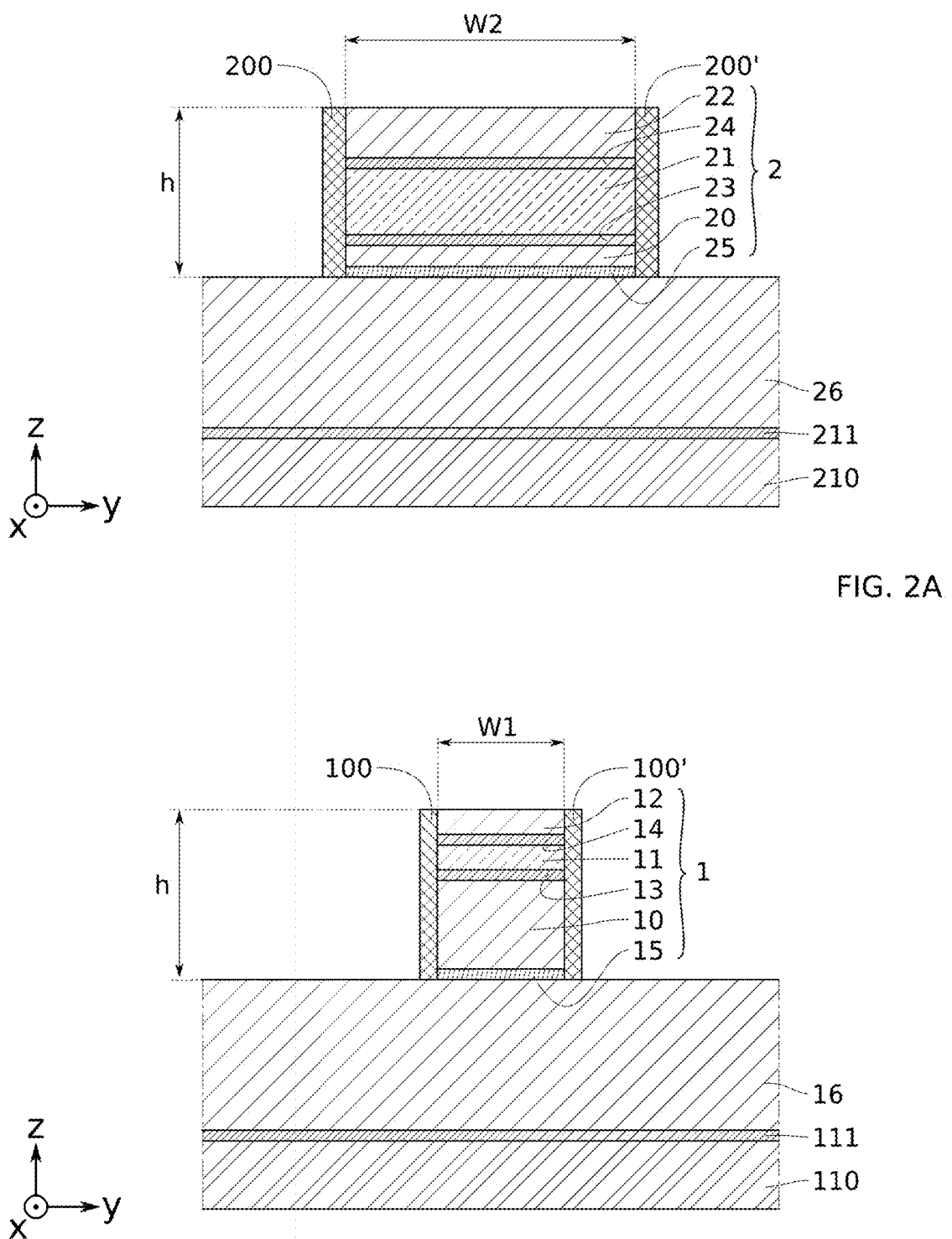
FIGS. 2A, 2B respectively illustrate, as a cross-section, a second and a first optoelectronic device according to an embodiment of the present invention.

FIGS. 2A, 2B respectively illustrate a second optoelectronic device and a first optoelectronic device comprising second and first protruding structures of the same height h. The second optoelectronic device is sized to operate at a wavelength $\lambda_2$=9.6 μm. The first optoelectronic device is sized to operate at a wavelength $\lambda_1$=4.2 μm. The thicknesses of the layers 15, 10, 13, 11, 14, 12 of the first protruding structure 1 have been sized according to the sizing rules stated above ([Math19] and [Math 20]), from the thicknesses of the layers 25, 20, 23, 21, 24, 22 of the second protruding structure 2.

The width W1 of the first protruding structure 1 has also been sized according to the sizing rules stated above ([Math 22] and [Math 23]), from the width W2 of the second protruding structure 2.

Figure 3A:
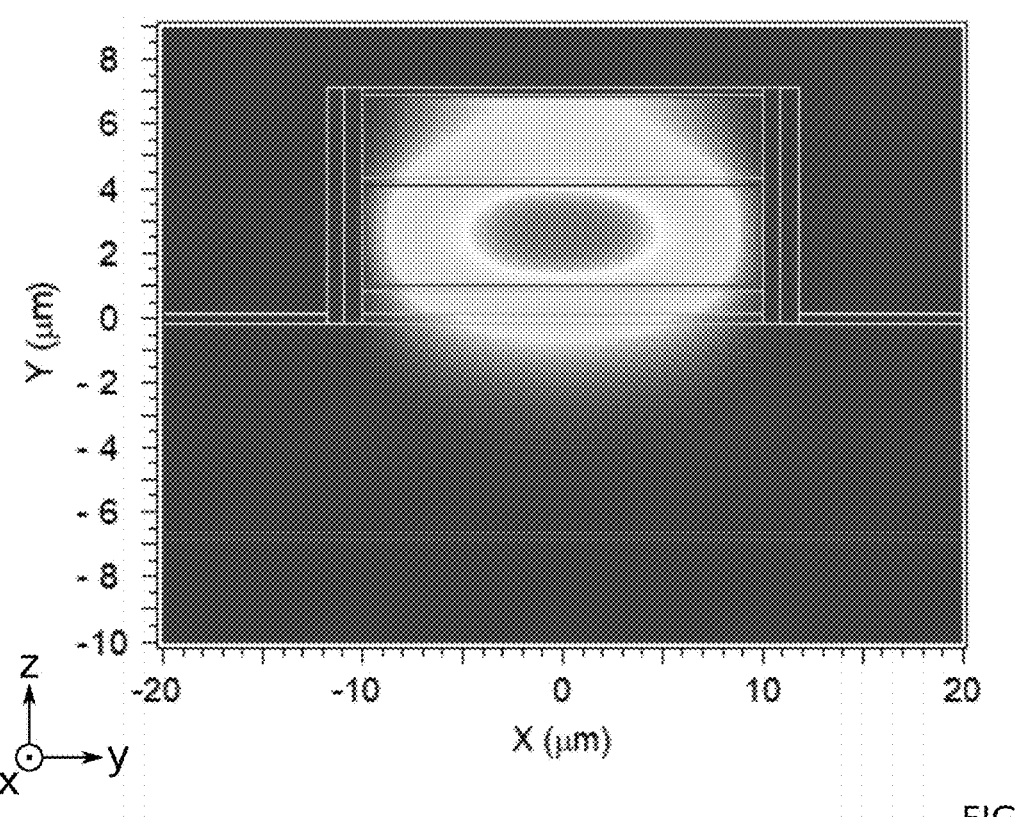
FIGS. 3A, 3B illustrate, as a cross-section, a simulated distribution of the light radiation propagating in the second and first optoelectronic devices of the embodiment illustrated in FIGS. 2A, 2B.
Figure 3B:
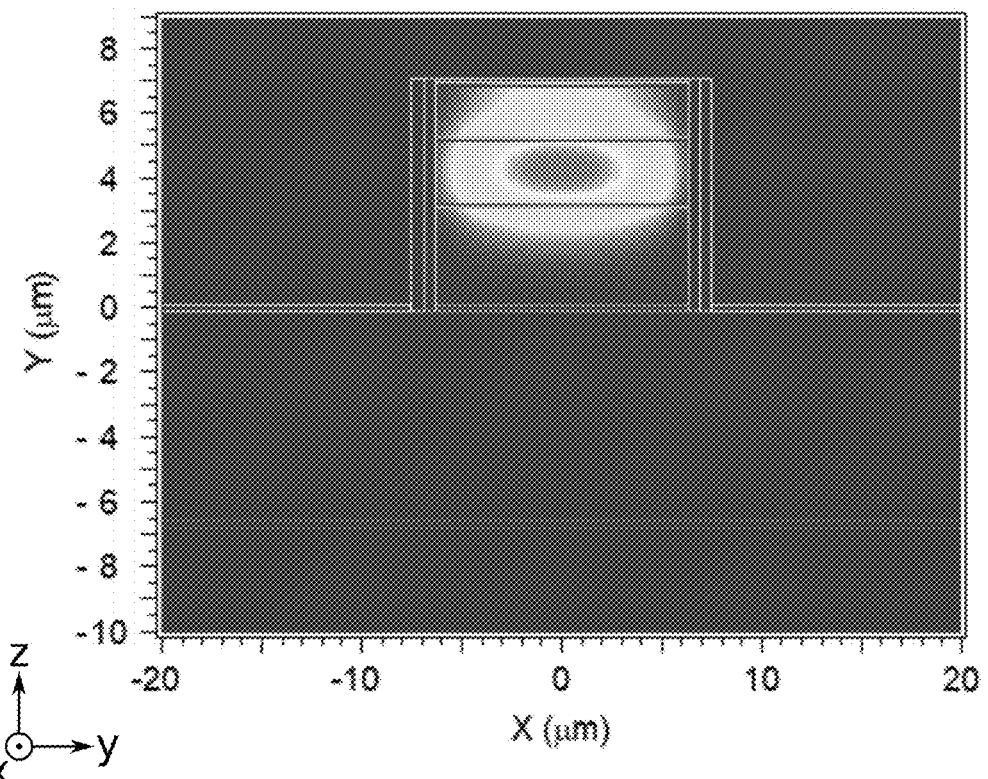

FIGS. 3A, 3B respectively illustrate the distributions of the second and first light radiations in the second and first optoelectronic devices illustrated in FIGS. 2A, 2B. It appears that the sizing carried out according to the sizing rules stated above makes it possible to effectively confine each of the second and first light radiations within the second and first optoelectronic devices. Thus, the first and second optoelectronic devices have the optical properties required for their operation, while advantageously having first and second protruding structures of the same height h.

Figure 4:
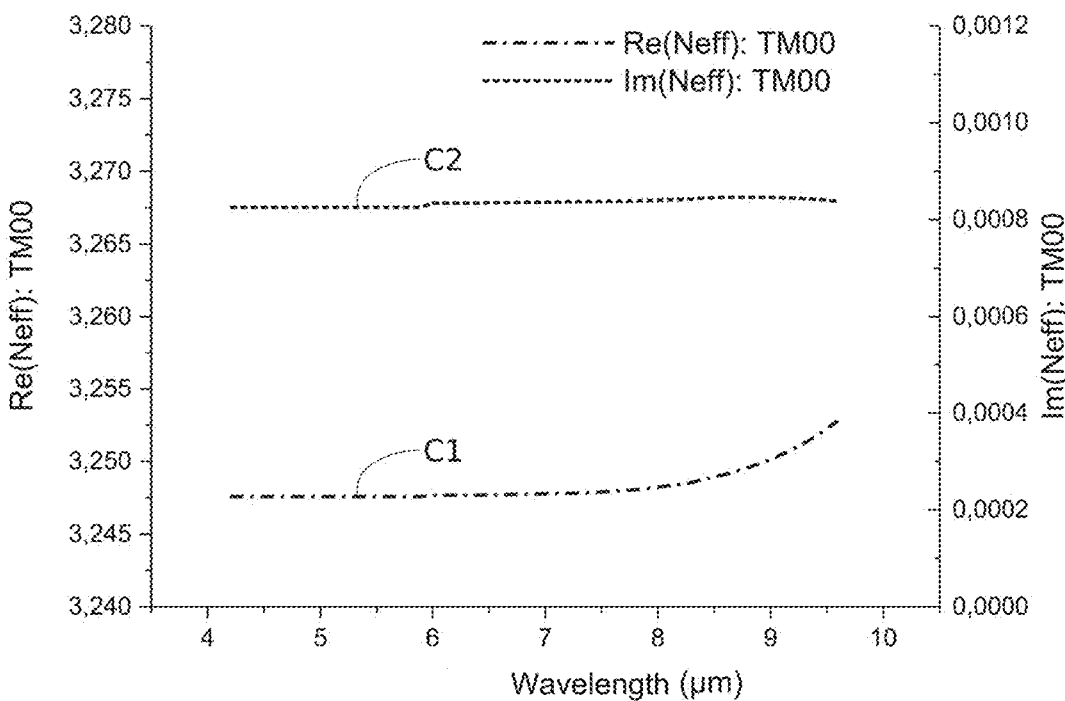
FIG. 4 illustrates an effective index variation and an optical loss variation according to the wavelength, simulated for different optoelectronic devices emitting at different wavelengths, according to an embodiment of the present invention.
Figure 5:
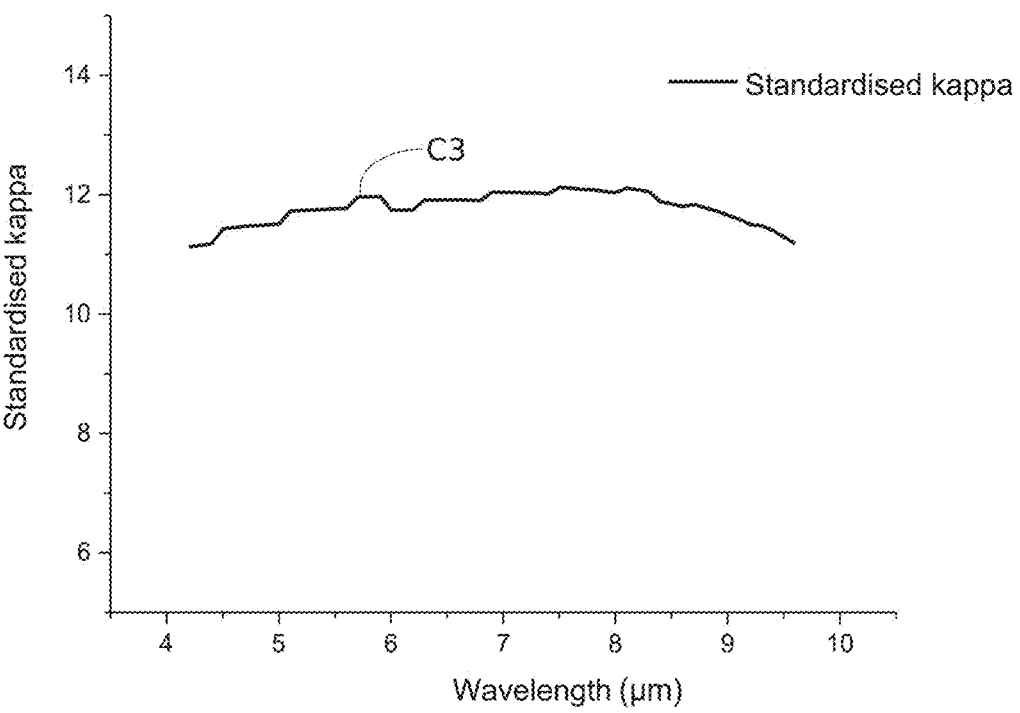
FIG. 5 illustrates a variation of the standardised coupling constant according to the wavelength, simulated for different optoelectronic devices emitting at different wavelengths, according to an embodiment of the present invention.

FIGS. 4 and 5 illustrate the variations of certain optical parameters according to the wavelength, for an infinite number of optoelectronic devices sized "by homothety", according to the sizing rules stated above. It appears that the sizing by homothety makes it possible to obtain almost constant effective indices (FIG. 4, curve C1) according to the wavelength, between 4.2 μm and 9.6 μm. The sizing by homothety also makes it possible to maintain the optical losses (FIG. 4, curve C2) at a very low level for wavelengths of between 4.2 μm and 9.6 μm. The sizing by homothety also makes it possible to obtain an almost constant standardised coupling constant κ* (FIG. 5, curve C3) of between 4.2 μm and 9.6 μm.

In practice, the sizing by homothety is carried out for only a few wavelengths of the MIR wavelength range. For example, the range of wavelengths is subdivided into intervals of around 500 nm or 1 μm, and the sizing by homothety is carried out for the central wavelengths of these intervals.

The sizing by homothety makes it possible, in particular, to manufacture distributed feedback (DFB) quantum cascade lasers (QCL) emitting in a wide MIR wavelength range with satisfactory properties, while advantageously providing a constant device height h. This makes it possible to pool a certain number of technological steps after formation of the different stacks corresponding to the different devices.

Figure 6:
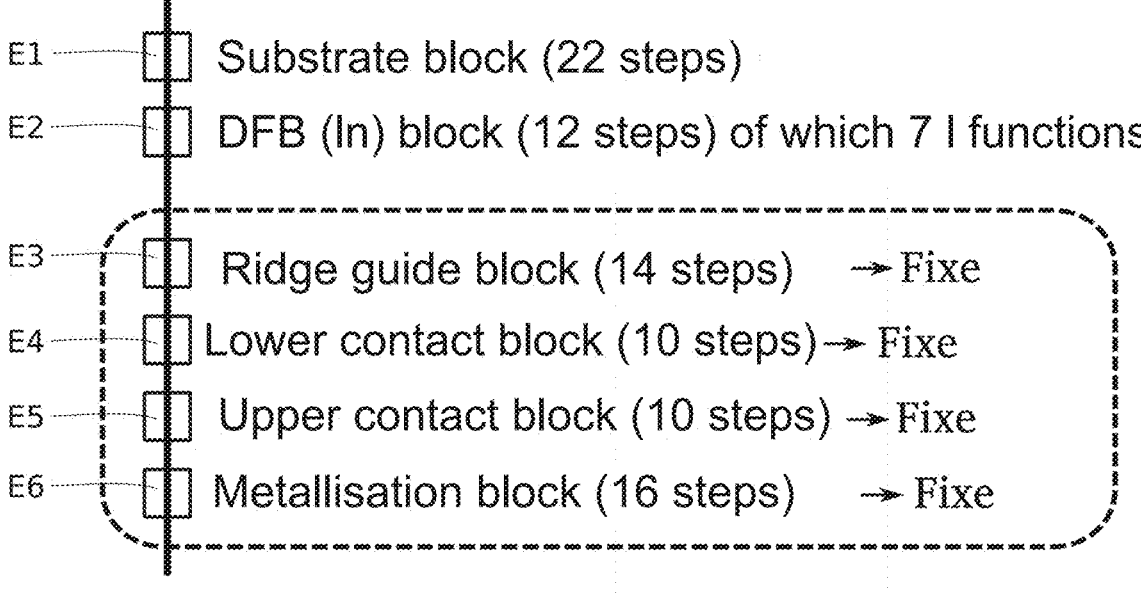
FIG. 6 illustrates a method flow comprising technological steps which are common to producing different optoelectronic devices emitting at different wavelengths, according to an embodiment of the present invention.

FIG. 6 illustrates a technological method flow corresponding to the manufacturing of DFB QCL lasers.

The block E1 corresponds to the formation of the stack of layers on the substrate. The block E1 typically comprises twenty-two steps. This block E1 is specific to the device to be manufactured. The twenty-two steps are therefore repeated n times to manufacture n different devices.

The block E2 corresponds to the etching of the DFB on the stack of layers. The block E2 typically comprises twelve steps. The sizing of the DFB depends on the wavelength. This block E2 is therefore specific to the device to be manufactured. The twelve steps, therefore some can be pooled, are therefore repeated n times to manufacture n different devices.

The block E3 corresponds to the etching of the stack to form the protruding structure of the devices. The block E3 typically comprises fourteen steps. Advantageously, the n different devices have, according to the invention, a protruding structure of the same height h. The block E3 can therefore be carried out one single time for all of the n devices. This block E3 comprises a set of steps common to the manufacturing of the n different devices.

The block E4 corresponds to the formation of the lower contact of the devices. The block E4 typically comprises ten steps. Advantageously, the n different devices have, according to the invention, a protruding structure of the same height h. The block E4 can therefore be carried out one single time for all of the n devices. This block E4 comprises a set of steps (for example, spreading of photolithographic resin, insolation of the resin along one same focal length, deposition, CMP removal along one same height, etc.) common to the manufacturing of the n different devices.

The block E5 corresponds to the formation of the upper contact of the devices. The block E5 typically comprises ten steps. Advantageously, the n different devices have, according to the invention, a protruding structure of the same height h. The block E5 can therefore be carried out one single time for all of the n devices. This block E5 comprises a set of steps (for example, spreading of photolithographic resin, insolation of the resin along one same focal length, deposition, CMP removal along one same height, etc.) common to the manufacturing of the n different devices.

The block E6 corresponds to a metallisation; this can make it possible, for information, to form metal studs on the electric contacts on the DFBs and to form routing elements for the output of the lower and upper contacts. The block E6 typically comprises sixteen steps. Advantageously, the n different devices have, according to the invention, a protruding structure of the same height h. The block E6 can therefore be carried out one single time for all of the n devices. This block E6 comprises a set of steps common to the manufacturing of the n different devices.

Contrary to conventional method flows, wherein blocks E1 to E6 are all carried out n times to manufacture n different devices (that is a total of n*84 steps), the flow according to the invention makes it possible, according to an example, to pool blocks E3 to E6 (50 steps). Only blocks E1 and E2 (34 steps) remain specific to the n devices to be manufactured. The method flow according to the invention thus makes it possible to advantageously decrease the total number of steps to n*34+50.

From the above, it clearly appears that the present invention advantageously makes it possible to significantly decrease the total number of steps of manufacturing n optoelectronic devices operating at n different wavelengths. The manufacturing time and the manufacturing cost of these n devices are thus advantageously decreased.

A particular application of the manufacturing method according to the invention relates to producing distributed feedback (DFB) quantum cascade lasers (QCL) emitting in a wide MIR wavelength range. Other applications can be considered. The invention is not limited to the embodiments described above.

The invention claimed is:

1. A method for manufacturing at least one first optoelectronic device operating at a first wavelength $\lambda 1$ and a second optoelectronic device operating at a second wavelength $\lambda 2 > \lambda 1$, the first optoelectronic device comprising a first stack along a direction z on a first substrate, the first stack comprising a first lower encapsulation layer of thickness e10 along the direction z and a plurality of first layers of thickness e1$i$ (i=1 . . . n) along the direction z, and the second optoelectronic device comprising a second stack along the direction z on a second substrate, the second stack comprising a second lower encapsulation layer of thickness e20 along the direction z and a plurality of second layers of thickness e2$i$ (i=1 . . . n) along the direction z, said second layers of thickness e2$i$ having optical functions similar to those of the first layers of thickness e1$i$, the method comprising:

forming the second stack on the second substrate by sizing the thicknesses e20 and e2$i$, i=1 . . . n, according to the second wavelength $\lambda 2$, forming the first stack on the first substrate by sizing the thicknesses e10 and e1$i$ according to:

$$e1i = e2i \cdot \frac{\lambda 1}{\lambda 2} \cdot \alpha i \text{ with } 0.7 \leq \alpha i \leq 1.3$$

$$e10 = e20 + \sum_{i=1}^{n} e2i - \sum_{i=1}^{n} e1i, \text{ and}$$

performing at least one same technological step on the first and second stacks, including an etching of the first and second stacks along one same depth along z, so as to obtain the first and second optoelectronic devices, wherein the first and second stacks each comprise exactly n+1 layers with n≥2, and have a same total height, e10 is calculated such that e10≠e20, the first stack is formed directly on the first substrate, and the second stack is formed directly on the second substrate.

2. The method according to claim 1, wherein the at least one same technological step comprises one or more steps taken from among: an etching along z of a waveguide pattern, a passivation, a formation of an upper electric contact, a formation of a lower electric contact, or a metallisation.

3. The method according to claim 1, wherein the plurality of first layers of thickness e1$i$ comprises at least one first active layer of thickness e11 along z, to emit or receive a radiation having the first wavelength $\lambda 1$, and a first upper encapsulation layer of thickness e12 along z, and wherein the plurality of second layers of thickness e2$i$ comprises at least one second active layer of thickness e21 along z, to emit or receive a radiation having the second wavelength $\lambda 2$, and a second upper encapsulation layer of thickness e22 along z.

4. The method according to claim 3, wherein the plurality of first layers of thickness e1$i$ further comprises a first lower optical confinement layer of thickness e13 inserted between the first lower encapsulation layer and the first active layer, and a first upper optical confinement layer of thickness e14 inserted between the first upper encapsulation layer and the first active layer, and wherein the plurality of second layers of thickness e2$i$ further comprises a second lower optical confinement layer of thickness e23 inserted between the second lower encapsulation layer and the second active layer, and a second upper optical confinement layer of thickness e24 inserted between the second upper encapsulation layer and the second active layer with:

$$e11 = e21 \cdot \frac{\lambda 1}{\lambda 2} \cdot \alpha 1 \text{ with } 0.7 \leq \alpha 1 \leq 1.3,$$

$$e12 = e22 \cdot \frac{\lambda 1}{\lambda 2} \cdot \alpha 2 \text{ with } 0.7 \leq \alpha 2 \leq 1.3,$$

$$e13 = e23 \cdot \frac{\lambda 1}{\lambda 2} \cdot \alpha 3 \text{ with } 0.7 \leq \alpha 3 \leq 1.3,$$

$$e14 = e24 \cdot \frac{\lambda 1}{\lambda 2} \cdot \alpha 4 \text{ with } 0.7 \leq \alpha 4 \leq 1.3, \text{ and}$$

$$e10 = (e20 + e21 + e22 + e23 + e24) - (e12 + e11 + e13 + e14).$$

5. The method according to claim 4, wherein the plurality of first layers of thickness e1$i$ further comprises a first stop layer of thickness e15 under the first lower encapsulation layer, and wherein the plurality of second layers of thickness e2$i$ further comprises a second stop layer of thickness e25 under the second lower encapsulation layer, with:

$$e15 = e25 \cdot \frac{\lambda 1}{\lambda 2} \cdot \alpha 25 \text{ with } 0.7 \leq \alpha 5 \leq 1.3.$$

6. The method according to claim 1, wherein the first and second stacks are etched along one same depth h along z to form first and second protruding structures, respectively having a first width W1 along a direction x and a first length L1 along a direction y, and a second width W2 along the direction x and a second length L2 along the direction y, said method further comprising, before etching of the first and second stacks:

determining the second width W2 and the second length L2 according to the second wavelength $\lambda 2$, and determining the first width W1 and the first length L1 according to:

$$W1 = W2 \cdot \frac{\lambda 1}{\lambda 2} \cdot \alpha_W \text{ with } 0.7 \leq \alpha_W \leq 1.3, \text{ and}$$

$$L1 = L2 \cdot \frac{\lambda 1}{\lambda 2} \cdot \alpha_L \text{ with } 0.7 \leq \alpha_L \leq 1.3.$$

7. The method of claim 6, wherein W1≠W2.

8. The method according to claim 1, further comprising a first etching configured to form a first array having a first depth on the first stack carried by the first substrate, and independently a second etching configured to form a second array having a second depth on the second stack carried by the second substrate.

9. The method according to claim 1, wherein the first and second wavelengths λ1, λ2 are chosen in a medium infrared range of between 2 μm and 15 μm.

10. The method of claim 1, wherein e2*i*≠e1*i* for at least one value of i.

11. A system for manufacturing at least one first optoelectronic device operating at a first wavelength λ1 and a second optoelectronic device operating at a second wavelength λ2>λ1, the system comprising at least one first substrate carrying a first stack along a direction z comprising a first lower encapsulation layer of thickness e10 along the direction z and a plurality of first layers of thickness e1*i* (i=1 . . . n) along the direction z, and a second substrate carrying a second stack along the direction z comprising a second lower encapsulation layer of thickness e20 along the direction z and a plurality of second layers of thickness e2*i* (i=1 . . . n) along the direction z, said second layers of thickness e2*i* having optical functions similar to those of the first layers of thickness e1*i*, the thicknesses e10, e20 and e1*i*, e2*i* satisfying the following relationships:

$$e1i = e2i \cdot \frac{\lambda 1}{\lambda 2} \cdot \alpha i \text{ with } 0.7 \leq \alpha i \leq 1.3, \text{ and}$$

$$e10 = e20 + \sum_{i=1}^{n} e2i - \sum_{i=1}^{n} e1i$$

such that the first and second stacks have substantially one same height along z, wherein the first and second stacks each comprise exactly n+1 layers with n≥2, and have a same total height, $$e10 \neq e20,$$

the first stack is formed directly on the first substrate, and the second stack is formed directly on the second substrate.

12. The system according to claim 11, wherein the first stack is bordered by first trenches of depth h along the direction z and forms a first protruding structure, and the second stack is bordered by second trenches of a same depth h along the direction z and forms a second protruding structure.

13. The system according to claim 12, wherein the first protruding structure has a first width W1 along a direction x and a first length L1 along a direction y, and the second protruding structure has a second width W2 along the direction x and a second length L2 along the direction y, the first and second widths W1, W2 and the first and second lengths L1, L2 verifying the following relationships:

$$W1 = W2 \cdot \frac{\lambda 1}{\lambda 2} \cdot \alpha_W \text{ with } 0.7 \leq \alpha_W \leq 1.3, \text{ and}$$

$$L1 = L2 \cdot \frac{\lambda 1}{\lambda 2} \cdot \alpha_L \text{ with } 0.7 \leq \alpha_L \leq 1.3.$$

14. The system of claim 13, wherein W1≠W2.

15. The system according to claim 11, wherein the plurality of first layers of thickness e1*i* comprises at least one first active layer of thickness e11 along z, intended to emit or receive a radiation having the first wavelength 21, and a first upper encapsulation layer of thickness e12 along z, and wherein the plurality of second layers of thickness e2*i* comprises at least one second active layer of thickness e21 along z, intended to emit or receive a radiation having the second wavelength λ2, and a second upper encapsulation layer of thickness e22 along z, with:

$$e12 = e22 \cdot \frac{\lambda 1}{\lambda 2} \cdot \alpha 2 \text{ with } 0.7 \leq \alpha 2 \leq 1.3, \text{ and}$$

$$e11 = e21 \cdot \frac{\lambda 1}{\lambda 2} \cdot \alpha 1 \text{ with } 0.7 \leq \alpha 1 \leq 1.3.$$

16. The system according to claim 11, wherein the first and second substrates are based on silicon, and wherein the first and second stacks are based on III-V materials, the first and second stacks respectively comprising first and second optical isolation layers configured to avoid an optical coupling at the wavelengths λ1 and λ2 with the first and second substrates.

17. The system according to claim 11, wherein the first and second optoelectronic devices correspond to first and second distributed feedback quantum cascade lasers.

\* \* \* \* \*